United States Patent
Wang

(10) Patent No.: US 8,643,442 B2
(45) Date of Patent: Feb. 4, 2014

(54) OSCILLATOR CIRCUIT

(75) Inventor: Meng Wang, Tanggu (CN)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 13/607,812

(22) Filed: Sep. 10, 2012

(65) Prior Publication Data

US 2013/0234801 A1 Sep. 12, 2013

(30) Foreign Application Priority Data

Mar. 12, 2012 (CN) .......................... 2012 1 0096699

(51) Int. Cl.
  *H03K 3/0231* (2006.01)
(52) U.S. Cl.
  USPC ........... 331/111; 331/143; 331/175; 331/176; 331/145
(58) Field of Classification Search
  USPC ........................... 331/111, 143, 175, 176, 145
  See application file for complete search history.

(56) References Cited

U.S. PATENT DOCUMENTS

| | | | |
|---|---|---|---|
| 3,904,988 A | 9/1975 | Hsiao | |
| 5,699,024 A * | 12/1997 | Manlove et al. | 331/111 |
| 6,052,035 A | 4/2000 | Nolan | |
| 6,356,161 B1 | 3/2002 | Nolan | |
| 6,456,170 B1 | 9/2002 | Segawa | |
| 2006/0226922 A1* | 10/2006 | Rajagopal et al. | 331/143 |
| 2010/0013566 A1* | 1/2010 | Kim | 331/111 |

* cited by examiner

*Primary Examiner* — Arnold Kinkead
(74) *Attorney, Agent, or Firm* — Charles Bergere

(57) ABSTRACT

An oscillator circuit includes a signal generator having a compensation frequency output node that provides a compensation frequency signal at the compensation frequency output node. A pulse generator having a pulsed signal output node and a pulse generator input node is coupled to the compensation frequency output node and converts the compensation frequency signal into a series of compensation binary pulses having a constant pulse duration regardless of variations in the duty cycle of the compensation binary pulses. An oscillator module having at least two capacitors, an oscillator output node and a pulsed signal input node is coupled to the pulsed signal output node, and provides an output signal that is at a frequency dependent on charging rates of the capacitors. Drift variations in the capacitors are offset by variations in a duty cycle of the compensation binary pulses supplied in order to maintain constant charging rates of the capacitors.

20 Claims, 5 Drawing Sheets

OSCILLATOR CIRCUIT

BACKGROUND OF THE INVENTION

The present invention relates to oscillators, and more particularly, to oscillators with sampling current compensation for offsetting drift variations.

Oscillator circuits are found in many electronic circuit applications and are often used for generating clock signals that control the timing of circuits or control the logic state of a device. For example, oscillator circuits can be used in conjunction with many circuits such as DC/DC converters, audio receivers, counters, shifters, microprocessors and FM (frequency modulation) circuitry. Typically, the frequency of the clock signal provided by an oscillator circuit is determined primarily by charging and discharging of one or more capacitors. Such charging and discharging is often controlled by constant current sources or current mirrors supplying charge currents to the capacitors and the discharging is effected by controlling transistors coupled across the capacitors. However, ambient temperature variations and process drift can cause variations in electrical characteristics of these capacitors and transistors thereby causing the frequency of the clock signal to vary. It would therefore be beneficial if oscillator circuits could be configured to reduce the effects of clock signal frequency variations caused by ambient temperature variations.

BRIEF DESCRIPTION OF THE DRAWINGS

The invention, together with objects and advantages thereof, may best be understood by reference to the following description of preferred embodiments together with the accompanying drawings in which.

DETAILED DESCRIPTION OF PREFERRED EMBODIMENTS

Figure 1:
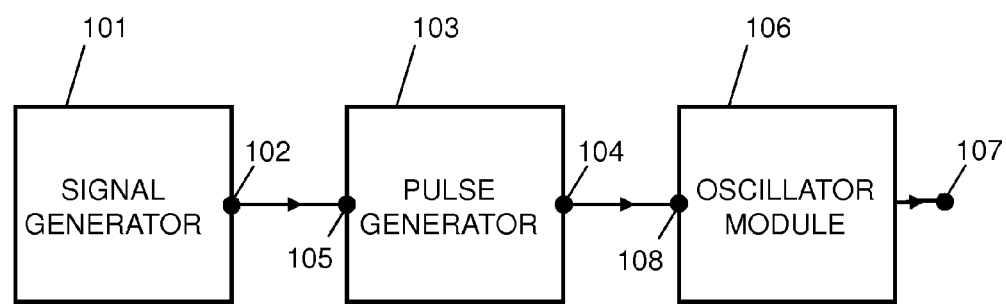
FIG. 1 is a schematic circuit diagram of an oscillator circuit in accordance with a preferred embodiment of the present invention.

The detailed description set forth below in connection with the appended drawings is intended as a description of presently preferred embodiments of the invention, and is not intended to represent the only forms in which the present invention may be practiced. It is to be understood that the same or equivalent functions may be accomplished by different embodiments that are intended to be encompassed within the spirit and scope of the invention. In the drawings, like numerals are used to indicate like elements throughout. Furthermore, terms "comprises," "comprising," or any other variation thereof, are intended to cover a non-exclusive inclusion, such that module, circuit, device components, method steps and structures that comprises a list of elements does not include only those elements but may include other elements not expressly listed or inherent to such module, circuit, steps or device components. An element or step proceeded by "comprises" does not, without more constraints, preclude the existence of additional identical elements or steps that comprises the element or step. Furthermore, in this specification the terms gate, source and drain and be interchanged respectively with the terms base, emitter and collector.

In one embodiment, the present invention provides an oscillator circuit that includes a signal generator having a compensation frequency output node, wherein in operation the signal generator provides a compensation frequency signal at the compensation frequency output node. A pulse generator having a pulsed signal output node and a pulse generator input node is coupled to the compensation frequency output node. The pulse generator converts the compensation frequency signal into a series of compensation binary pulses at the pulsed signal output node, the compensation binary pulses having a substantially constant pulse duration regardless of variations in the duty cycle of the compensation binary pulses. The oscillator circuit also has an oscillator module that includes at least two capacitors, an oscillator output node and a pulsed signal input node coupled to the pulsed signal output node. The oscillator module provides an output signal at the oscillator output node, the output signal being at a frequency that is dependent on charging rates of the capacitors. Drift variations in electrical characteristics of the capacitors are offset by variations in a duty cycle of the compensation binary pulses supplied to the pulsed signal input node thereby maintaining substantially constant charging rates of the capacitors.

In another embodiment, the present invention provides an oscillator module including an oscillator output node and a pulsed signal input node. At least two capacitors are provided, wherein a first electrode of each of the capacitors coupled to a supply voltage node through a respective charge current mirror transistor of a charge current mirror. A second electrode of each of the capacitors is coupled to a return voltage node, and a first electrode of each of the capacitors is coupled to the return voltage node through a respective discharge transistor. The first electrode of each of the capacitors is further coupled to the return voltage node through a charge current control transistor that has a gate electrode coupled to the compensation pulsed input node. The oscillator module provides an output signal at the oscillator output node; the output signal being at a frequency that is dependent on charging rates of the capacitors. Drift variations in electrical characteristics of the capacitors are offset by variations in a duty cycle of the compensation binary pulses supplied to the pulsed signal input node thereby maintaining substantially constant charging rates of the capacitors.

In a further embodiment the present invention provides a method for generating an output signal at an output of an oscillator module. The method includes providing a compensation frequency signal and converting the compensation frequency signal into compensation binary pulses having a substantially constant pulse duration regardless of variations in the duty cycle of the compensation binary pulses. The method further includes altering charge currents of set and reset capacitors of an oscillator module by diverting part of the charge currents through charge current control transistors that are controlled by the compensation binary pulses. There is also included in the method a process of providing the output signal at the oscillator output. The output signal is at frequency that is dependent on charging rates of the set and reset capacitors. Drift variations in electrical characteristics of the set and reset capacitors are offset by variations in the duty cycle of the compensation binary pulses thereby maintaining substantially constant charging rates of the capacitors.

As will be apparent to those of skill in the art, the present invention is particularly useful for providing a constant frequency signal that is not readily affected by drift caused by variations in ambient temperatures.

Referring now to FIG. 1, a circuit diagram of an oscillator circuit 100 in accordance with a preferred embodiment of the present invention is shown. The oscillator circuit 100 has a signal generator 101 with a compensation frequency output node 102. In operation, the signal generator 101 provides a compensation frequency signal Sf at a frequency Fcs at the compensation frequency output node 102.

The oscillator circuit 100 has a pulse generator 103 with a pulsed signal output node 104 and a pulse generator input node 105 coupled to the compensation frequency output node 102. In operation, the pulse generator 103 converts the compensation frequency signal Sf into a series of compensation binary pulses Cp at the pulsed signal output node 104. The pulse generator 103 is designed to operate so that the compensation binary pulses Cp have a substantially constant pulse duration D regardless of variations in the duty cycle of the compensation binary pulses Cp. The oscillator circuit 100 also has an oscillator module 106 with an oscillator output node 107 and a pulsed signal input node 108 coupled to the pulsed signal output node 104.

Figure 2:
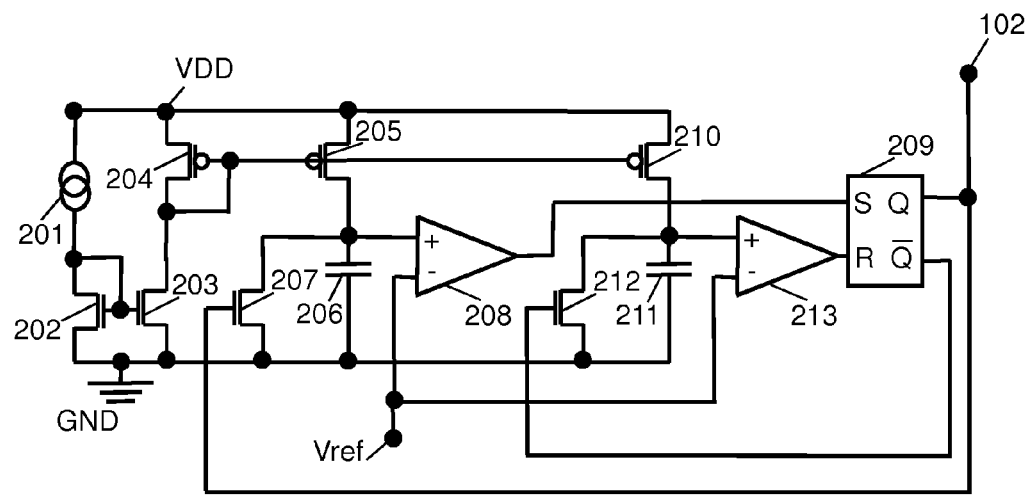
FIG. 2 is a schematic circuit diagram of a signal generator of the oscillator circuit of FIG. 1, in accordance with an embodiment of the present invention.

FIG. 2 is a circuit diagram of a preferred embodiment of the signal generator 101. The signal generator 101 includes a constant current source 201 coupled between a supply voltage node VDD on one side and a drain and a gate electrode of a first reference transistor 202 on the other side. The gate electrode of the first reference transistor 202 is coupled to a gate electrode of a first mirror transistor 203 and the source electrodes of both transistors 202, 203 are coupled to a return voltage node (ground GND).

A second reference transistor 204 with a source electrode coupled to the supply voltage node VDD and a gate electrode of the second reference transistor 204 is coupled to its own drain electrode, and to both a drain electrode of the first mirror transistor 203 and to a gate electrode of a second mirror transistor 205. A source electrode of the second mirror transistor 205 is coupled to the supply voltage node VDD and a drain electrode of the second mirror transistor 205 is coupled to a first electrode of a set capacitor 206. A second electrode of the set capacitor 206 is coupled to ground GND and the first electrode of the set capacitor 206 is also coupled to both a drain electrode of a set discharge transistor 207 and a positive input of a set comparitor 208.

The signal generator 101 further includes a Set-Reset latch 209 with a set input S coupled to an output of the set comparator 208. There is also a third mirror transistor 210 that has a source electrode coupled to the supply voltage node VDD, a gate electrode coupled to the gate electrode of the second reference transistor 204, and a drain electrode that is coupled to a first electrode of a reset capacitor 211. A second electrode of the reset capacitor 211 is coupled to ground GND and the first electrode of the reset capacitor 211 is also coupled to both a drain electrode of a reset discharge transistor 212 and a positive input of a reset comparator 213. An output of the reset comparitor 213 is coupled to a reset input R of the Set-Reset latch 209 and negative inputs of both comparators 208,213 are coupled to a common threshold voltage reference node Vref.

An output Qbar of the Set-Reset latch 209 is coupled to a gate electrode of the reset discharge transistor 212 and output Q of the Set-Reset latch 209 is coupled to a gate electrode of the set discharge transistor 207. The set discharge transistor 207 and reset discharge transistor 212 have source electrodes coupled to ground GND and as shown the compensation frequency output node 102 is coupled to the output Q of the Set-Reset latch 209. However, if desired, the compensation frequency output node 102 can be coupled to output Qbar of the Set-Reset latch 209. As will be apparent to a person skilled in the art, a compensation frequency signal Sf is provided to the compensation frequency output node 102 and the frequency of this compensation frequency signal Sf is dependent on charging rates of the set and reset capacitors 206, 211.

Figure 3:
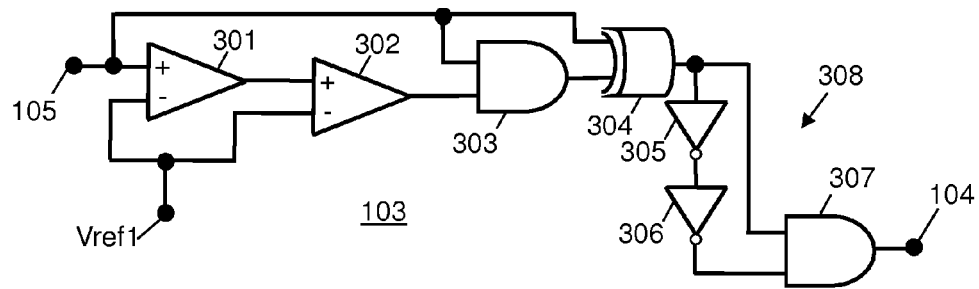
FIG. 3 is a schematic circuit diagram of a preferred embodiment of a pulse generator of the oscillator circuit of FIG. 1, in accordance with a preferred embodiment of the present invention.

FIG. 3 is a circuit diagram of a preferred embodiment of the pulse generator 103 in accordance with a preferred embodiment of the present invention. The pulse generator 103 has a NMOS comparator 301 with a positive input coupled to the pulse generator input node 105 and an output coupled to a positive input of a PMOS comparator 302. An output of the PMOS comparator 302 is coupled to a first input of an AND gate 303 and a second input on the AND gate 303 is coupled directly to the pulse generator input node 105. An output of the AND gate 303 is coupled to a first input of an XOR gate 304 and a second input of the XOR gate 304 is coupled directly to the pulse generator input node 105. An output of the XOR gate 304 is coupled to the pulsed signal output node 104 through glitch removal circuitry 308. The glitch removal circuitry 308 includes an AND gate 307 with an output coupled to the pulsed signal output node 104 and two series connected inverters 305, 306. The output of the XOR gate 304 is coupled both directly to a first input of the AND gate 307 and indirectly to a second input of the AND gate 307 through series connected inverters 305, 306.

Negative inputs of both comparators 301,302 are coupled to a common threshold voltage reference node Vref1. This common threshold voltage reference node Vref1 is set at or near half the maximum voltage (logic 1 level) of the compensation frequency signal Sf. As a result, the level of reference node Vref1 provides for a suitable delay from the input of comparator 301 to the output of comparitor 302 thereby providing a delayed signal to an input of the AND gate 304.

Figure 4:
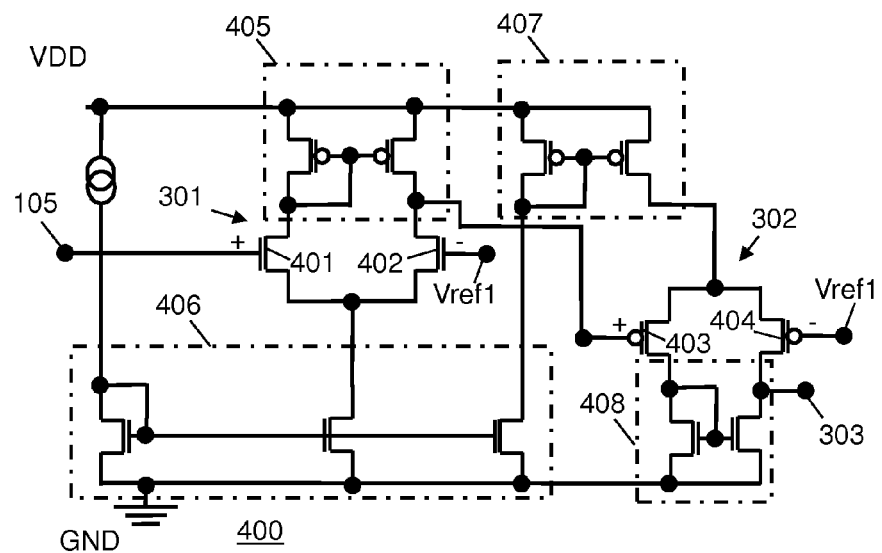
FIG. 4 is a schematic circuit diagram of an implementation of comparators of the pulse generator of FIG. 3, in accordance with a preferred embodiment of the present invention.

FIG. 4 is a circuit diagram of a transistor level implementation 400 of the comparators 301,302 in accordance with a preferred embodiment of the present invention. As illustrated, the NMOS comparator 301 comprises a pair of NMOS transistors 401,402 coupled to ground GND through a current mirror circuit 406 and the NMOS transistors 401,402 are coupled to the supply voltage node VDD through a current mirror circuit 405. The PMOS comparator 302 comprises a pair of PMOS transistors 403,404 coupled to ground GND through a current mirror circuit 408 and the PMOS transistors 403,404 are coupled to the supply voltage node VDD through a current mirror circuit 407.

Figure 5:
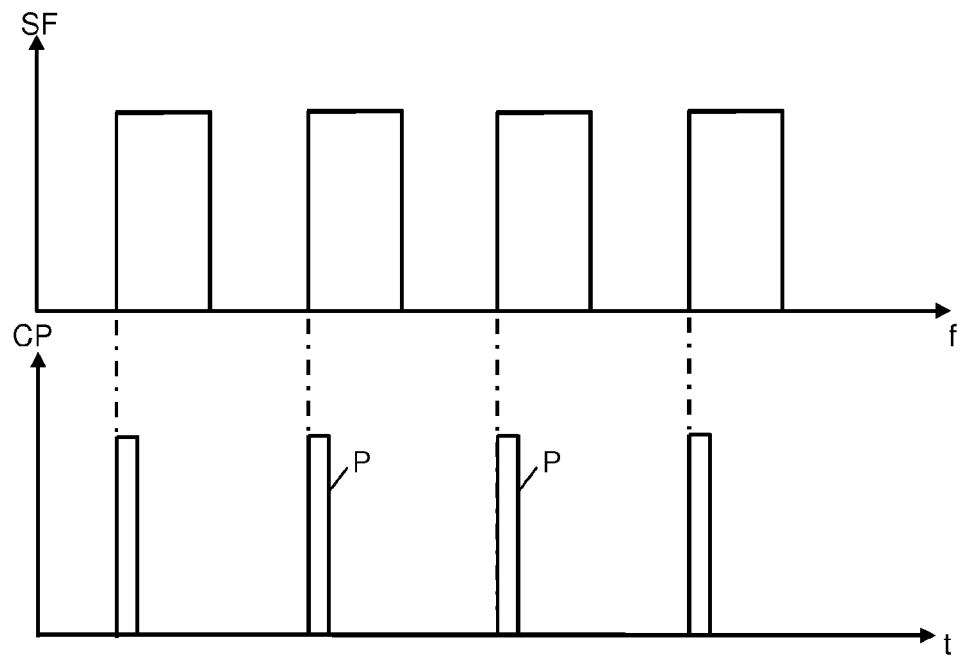
FIG. 5 is a waveform diagram illustrating the relationship between a compensation frequency signal and compensation binary pulses generated by the oscillator circuit of FIG. 1.

FIG. 5 is a waveform diagram illustrating the relationship between the compensation frequency signal Sf received at the pulse generator node 105 and the compensation binary pulses Cp provided at the pulsed signal output node 104. As shown, the compensation binary pulses Cp comprise a short duration pulse P generated, by the pulse generator 103, on leading edges of the compensation frequency signal Sf. These pulses P are generated by the difference in signal timing provided to the XOR gate 305, caused by the delays across the comparators 301 and 302, as will be apparent to a person skilled in the art. Also, the glitch removal circuitry 308 has a sufficient delay so that any short duration pulses or glitches that occur during a falling edge of the compensation frequency signal Sf do not form part of the compensation binary pulses Cp at the pulsed signal output node 104.

Figure 6:
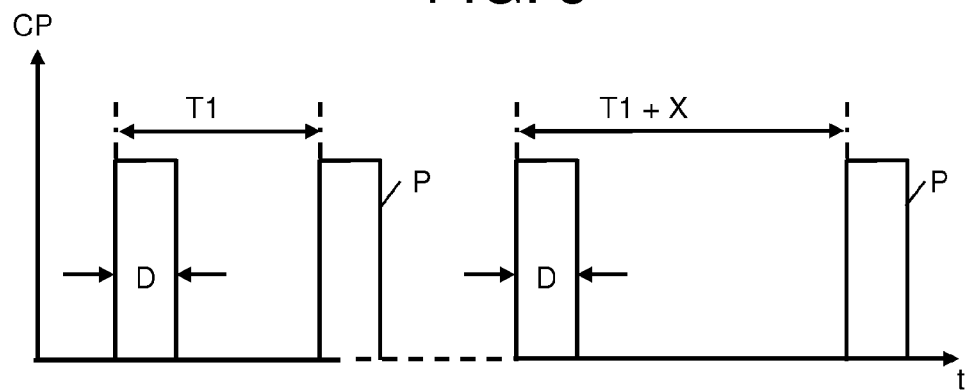
FIG. 6 is a waveform diagram illustrating the effects of drift on the compensation binary pulses of FIG. 5.

FIG. 6 illustrates the compensation binary pulses Cp provided at the pulsed signal output node 104 that have a varying duty cycle over time.

During a first period T1 of the compensation binary pulses Cp, the short duration pulse P has a duration D. However, due to drift over time the frequency Fcs of compensation frequency signal Sf can vary thereby resulting in a variation of the period of the compensation binary pulses CP. As shown, the period of the compensation binary pulses Cp has increased to T1+X but the short duration pulse P has maintained its duration D. This is because the duration D of the short duration pulse P is kept constant by the complementary characteristics of the NMOS and PMOS comparators 301, 302, whereas the frequency Fcs of compensation frequency signal Sf is susceptible to drift variations.

Figure 7:
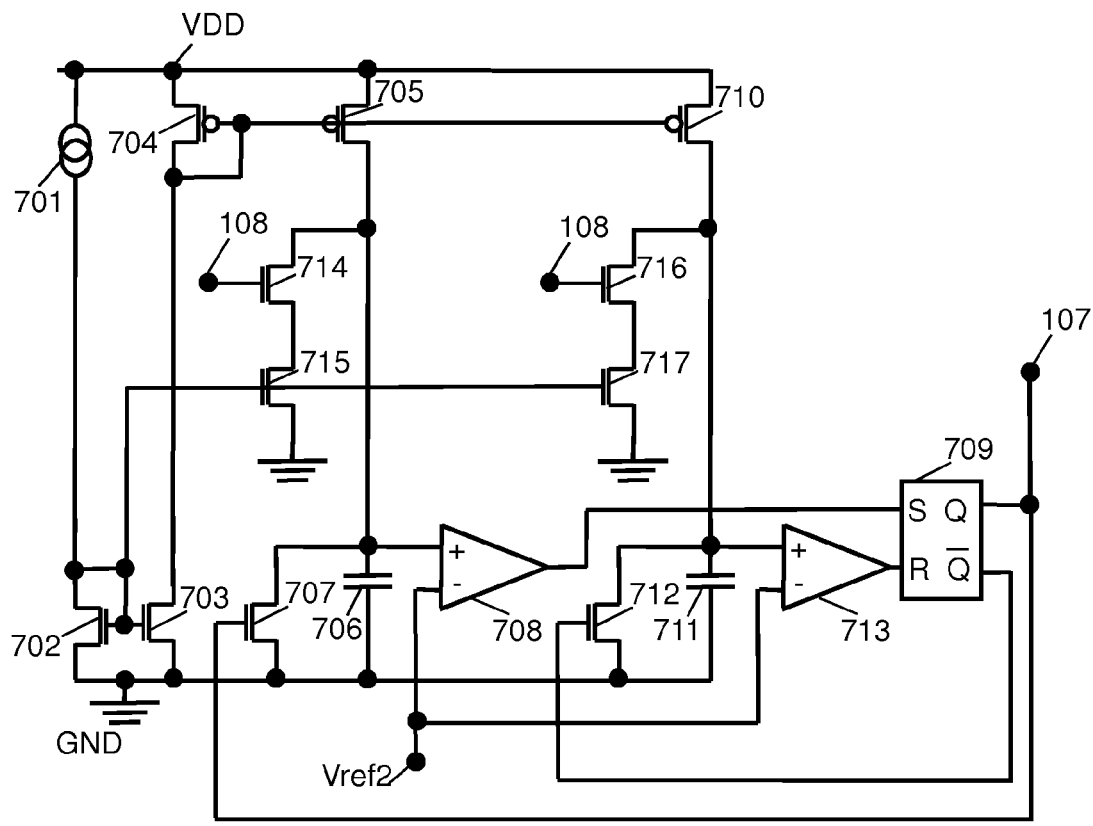
FIG. 7 is a schematic circuit diagram of an oscillator module of the oscillator circuit of FIG. 1, in accordance with a preferred embodiment of the present invention.

FIG. 7 is a circuit diagram of the oscillator module 106 in accordance with a preferred embodiment of the present invention. The oscillator module 106 includes a constant current source 701 coupled between a supply voltage node VDD on one side and a drain and a gate electrode of a first reference transistor 702 on the other side. The gate electrode of the first reference transistor 702 is coupled to a gate electrode of a first mirror transistor 703 and the source electrodes of both transistors 702, 703 are coupled to a return reference node (ground GND).

A second reference transistor 704 has a source electrode coupled to the supply voltage node VDD, and a gate electrode of the second reference transistor 704 (that is a current reference transistor in a charge current mirror) is coupled to its own drain electrode. The gate electrode of the second reference transistor 704 is also coupled to both a drain electrode of the first mirror transistor 703 and to a gate electrode of a first charge current mirror transistor 705 of the charge current mirror. A source electrode of the first charge current mirror transistor 705 is coupled to the supply voltage node VDD and a drain electrode of the first charge current mirror transistor 705 is coupled to a first electrode of a set capacitor 706. A second electrode of the set capacitor 706 is coupled to ground GND and the first electrode of the set capacitor 706 is also coupled to both a drain electrode of a set discharge transistor 707 and a positive input of a set comparitor 708.

The oscillator module 106 further includes an Set-Reset latch 709 with a set input S coupled to an output of the set comparator 708. There is also a second charge current mirror transistor 710 (of the charge current mirror) that has a source electrode coupled to the supply voltage node VDD, a gate electrode coupled to the gate electrode of the second reference transistor 704, and a drain electrode that is coupled to a first electrode of a reset capacitor 711. A second electrode of the reset capacitor 711 is coupled to ground GND and the first electrode of the reset capacitor 711 is also coupled to both a drain electrode of a reset discharge transistor 712 and a positive input of a reset comparator 713. An output of the reset comparator 713 is coupled to a reset input R of the Set-Reset latch 709 and negative inputs of both comparators 708, 713 are coupled to a common threshold voltage reference node Vref2. An output Qbar of the Set-Reset latch 709 is coupled to a gate electrode of the reset discharge transistor 712 and output Q of the Set-Reset latch 709 is coupled to a gate electrode of the set discharge transistor 707.

The oscillator module 106 also includes a first charge control mirror transistor 715 and a second charge control mirror transistor 717. Gate electrodes of the first and second charge control mirror transistors 715, 717 are coupled to the gate electrode of the first reference transistor 702 that is a reference transistor for a charge control current mirror. The first electrode of the set capacitor 706 is coupled to the return voltage node through a charge current control transistor 714 that has a gate electrode coupled to the compensation pulsed input node 108. More specifically, the charge current control transistor 714 couples the first electrode of the set capacitor 706 to the return voltage node through the charge control mirror transistor 715. Similarly, the first electrode of the reset capacitor 711 is coupled to the return voltage node through a charge current control transistor 716 that has a gate electrode coupled to the compensation pulsed input node 108. More specifically, the charge current control transitor 716 couples the first electrode of the reset capacitor 711 to the return voltage node through the charge control mirror transistor 717.

The set discharge transistor 707 and reset discharge transistor 712 have source electrodes coupled to ground GND and as shown the oscillator output node 107 is coupled to the output Q of the Set-Reset latch 709. However, if desired, the oscillator output node 107 can be coupled to output Qbar of the Set-Reset latch 709. As will be apparent to a person skilled in the art, an output signal Fout is provided to the output node 107 and the frequency of this output signal Fout is dependent on charging rates of the set and reset capacitors 706, 711.

Ideally, the set and reset capacitors 206, 211 of the signal generator 101 and the set and reset capacitors 706, 711 are formed in close proximity on a common silicon substrate and have the same silicon layout orientation. This therefore decreases the likelihood of variations in process tolerances and ambient temperature variations affecting the frequency of the output signal Fout.

Figure 8:
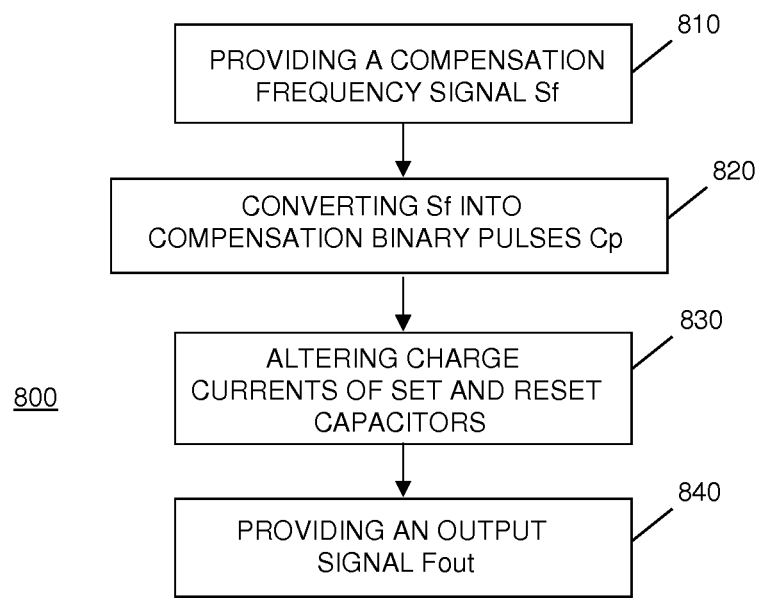
FIG. 8 is a flow chart illustrating a method for providing an output signal at an oscillator output node of the oscillator module of FIG. 7, in accordance with a preferred embodiment of the present invention.

FIG. 8 is a flow chart of a method 800 for providing an output signal at the oscillator output node 107 of the oscillator module 106. The method, at block 810, performs providing the compensation frequency signal Sf. The providing at block 810 is performed by the signal generator 101. Next, at block 820, a process of converting the compensation frequency signal Sf into compensation binary pulses Cp is performed by the pulse generator 103. The compensation binary pulses Cp have a substantially constant pulse duration regardless of variations in their duty cycle. At block 830 the oscillator module 106 performs altering charge currents of the set and reset capacitors 706, 711 by diverting part of the charge currents through the charge current control transistors 714, 716 that are controlled by the compensation binary pulses Cp. The oscillator module 106, at a providing block 840, provides the output signal Fout at the oscillator output node 107. In this regard, the output signal Fout is at frequency that is dependent on charging rates of the set and reset capacitors 706, 711. Drift variations in electrical characteristics of the set and reset capacitors 706, 711 are offset by variations in the duty cycle of the compensation binary pulses Cp thereby maintaining substantially constant charging rates of the set and reset capacitors 706, 711.

The charge current though the respective set and reset capacitors is determined by:

$$Icmt-K \times Iref \times Dcycle$$

where Icmt is the current provided by the charge current mirror transistor, KIref is an uninterrupted value of current that can be supplied by the charge control mirror transistor and Dcycle is the duty cycle of the compensation binary pulses. In summary, the value of current determined by K×Iref×Dcycle is a compensation current flowing through either of the charge current control transistors 714, 716. This compensation current compensates for variations in capacitance values of the set and reset capacitors 706, 711, to thereby provide constant charge rates of these capacitors 706, 711 regardless of drift variations in their electrical characteristics.

Ideally, the compensation binary pulses have a duty cycle of less than 20% and preferably the frequency of the compensation binary pulses Cp is at least 4 times the operating frequency of the output signal Fout at the oscillator output node 107.

Advantageously, the present invention reduces or at least alleviates the effects of clock output signal Fout frequency variations caused by ambient temperature variations. This is because the compensation binary pulses Cp have a substantially constant pulse duration D regardless of variations in the duty cycle of the compensation binary pulses Cp. Therefore, drift variations in electrical characteristics of the set and reset capacitors 706, 711 are offset by variations in a duty cycle of the compensation binary pulses Cp that provide for maintaining substantially constant charging rates of the capacitors 706, 711.

The description of the preferred embodiments of the present invention has been presented for purposes of illustration and description, but is not intended to be exhaustive or to limit the invention to the forms disclosed. It will be appreciated by those skilled in the art that changes could be made to the embodiments described above without departing from the broad inventive concept thereof. It is understood, therefore, that this invention is not limited to the particular embodiment disclosed, but covers modifications within the spirit and scope of the present invention as defined by the appended claims.

The invention claimed is:

1. An oscillator circuit, comprising:
   a signal generator having a compensation frequency output node, wherein in operation the signal generator provides a compensation frequency signal at the compensation frequency output node;
   a pulse generator having a pulsed signal output node and a pulse generator input node coupled to the compensation frequency output node, wherein in operation the pulse generator converts the compensation frequency signal into a series of compensation binary pulses at the pulsed signal output node, the compensation binary pulses having a substantially constant pulse duration regardless of variations in the duty cycle of the compensation binary pulses; and
   an oscillator module including at least two capacitors, an oscillator output node and a pulsed signal input node coupled to the pulsed signal output node, wherein in operation the oscillator provides an output signal at the oscillator output node, the output signal being at a frequency that is dependent on charging rates of the capacitors and wherein drift variations in electrical characteristics of the capacitors are offset by variations in a duty cycle of the compensation binary pulses supplied to the pulsed signal input node thereby maintaining substantially constant charging rates of the capacitors.

2. The oscillator circuit of claim 1, wherein a first electrode of each of the capacitors is coupled to a supply voltage node through a respective charge current mirror transistor of a charge current mirror, and a second electrode of each of the capacitors is coupled to a return voltage node, and wherein a first electrode of each of the capacitors is coupled to the return voltage node through a respective discharge transistor.

3. The oscillator circuit of claim 2, wherein the first electrode of each of the capacitors is further coupled to the return voltage node through a charge current control transistor that has a gate electrode coupled to the compensation pulsed input node.

4. The oscillator circuit of claim 3, wherein each charge current control transistor couples a respective first electrode of each of the capacitors to return voltage node through a charge control mirror transistor of a charge control current mirror.

5. The oscillator circuit of claim 4, wherein the charge current though one of the capacitors is determined by:

$$Icmt=KIref\times Dcycle$$

where Icmt is the current provided by the charge current mirror transistor, KIref is an uninterrupted value of current that can be supplied by the charge control mirror transistor and Dcycle is the duty cycle of the compensation binary pulses.

6. The oscillator circuit of claim 4, wherein the pulse generator includes NMOS and PMOS comparators.

7. The oscillator circuit of claim 4, wherein the pulse generator is configured so that the compensation binary pulses have a duty cycle of less than 20%.

8. The oscillator circuit of claim 4, wherein the frequency of the compensation binary pulses is at least 4 times the operating frequency of the output signal at the oscillator output node.

9. The oscillator circuit of claim 4, wherein the signal generator includes signal generator capacitors that determine an operating frequency of compensation frequency signal, the operating frequency being dependent on charging rates of the signal generator capacitors and wherein the signal generator capacitors and the capacitors of the oscillator module are formed in close proximity on a common silicon substrate and have the same silicon layout orientation.

10. An oscillator module, including:
    an oscillator output node and a pulsed signal input node; and
    at least two capacitors wherein a first electrode of each of the capacitors is coupled to a supply voltage node through a respective charge current mirror transistor of a charge current mirror, and a second electrode of each of the capacitors is coupled to a return voltage node, and wherein a first electrode of each of the capacitors is coupled to the return voltage node through a respective discharge transistor and further coupled to the return voltage node through a charge current control transistor that has a gate electrode coupled to the compensation pulsed input node,
    wherein in operation the oscillator provides an output signal at the oscillator output node, the output signal being at a frequency that is dependent on charging rates of the capacitors and wherein drift variations in electrical characteristics of the capacitors are offset by variations in a duty cycle of the compensation binary pulses supplied to the pulsed signal input node thereby maintaining substantially constant charging rates of the capacitors.

11. The oscillator module of claim 10, wherein each charge current control transistor couples a respective first electrode of each of the capacitors to return voltage node through a charge control mirror transistor of a charge control current mirror.

12. The oscillator module of claim 11, wherein the charge current though one of the capacitors is determined by:

$$Icmt=KIref\times Dcycle$$

where Icmt is the current provided by the charge current mirror transistor, KIref is an uninterrupted value of current that can be supplied by the charge control mirror transistor and Dcycle is the duty cycle of the compensation binary pulses.

13. The oscillator module of claim 12, wherein in operation the compensation binary pulses have a duty cycle of less than 20%.

14. The oscillator module of claim 13, wherein in operation frequency of the compensation binary pulses is at least 4 times the operating frequency of the output signal at the oscillator output node.

15. A method for providing an output signal at an output of an oscillator module, the method including:
   providing a compensation frequency signal;
   converting the compensation frequency signal into compensation binary pulses having a substantially constant pulse duration regardless of variations in the duty cycle of the compensation binary pulses;
   altering charge currents of set and reset capacitors of an oscillator module by diverting part of the charge currents through charge current control transistors that are controlled by the compensation binary pulses; and
   providing the output signal at the oscillator output, wherein the output signal is at frequency that is dependent on charging rates of the set and reset capacitors and wherein drift variations in electrical characteristics of the set and reset capacitors are offset by variations in the duty cycle of the compensation binary pulses thereby maintaining substantially constant charging rates of the capacitors.

16. The method of claim 15, wherein the charge current control transistors couple respective first electrodes of the set and reset capacitors to ground through a charge control mirror transistor of a charge control current mirror.

17. The method of claim 16, wherein the charge current though the set and reset capacitors is determined by:

$$Icmt = K \times Iref \times Dcycle$$

where Icmt is the current provided by the charge current mirror transistor, KIref is an uninterrupted value of current that can be supplied by the charge control mirror transistor and Dcycle is the duty cycle of the compensation binary pulses.

18. The method of claim 17, wherein the compensation binary pulses have a duty cycle of less than 20%.

19. The method of claim 18, wherein the frequency of the compensation binary pulses is at least 4 times the operating frequency of the output signal at the oscillator output.

20. The method of claim 17, wherein the compensation binary pulses are provided by a pulse generator that includes NMOS and PMOS comparators.

* * * * *

UNITED STATES PATENT AND TRADEMARK OFFICE
CERTIFICATE OF CORRECTION

PATENT NO.       : 8,643,442 B2
APPLICATION NO.  : 13/607812
DATED            : February 4, 2014
INVENTOR(S)      : Meng Wang Page 1 of 1

It is certified that error appears in the above-identified patent and that said Letters Patent is hereby corrected as shown below:

In the Claims

Column 8, Line 14, please change "Icmt-KxIrefxDcycle" to be --Icmt - K X Iref X Dcycle--

Column 8, Line 66, please change "Icmt-KxIrefxDcycle" to be --Icmt - K X Iref X Dcycle--

Column 10, Line 12, please change "Icmt-KxIrefxDcycle" to be --Icmt - K X Iref X Dcycle--

Signed and Sealed this
Twenty-second Day of July, 2014

Michelle K. Lee
*Deputy Director of the United States Patent and Trademark Office*